(12) United States Patent
Terada et al.

(10) Patent No.: US 10,364,498 B2
(45) Date of Patent: Jul. 30, 2019

(54) GAS SUPPLY PIPE, AND GAS TREATMENT EQUIPMENT

(71) Applicant: KABUSHIKI KAISHA TOSHIBA, Minato-ku (JP)

(72) Inventors: Takahiro Terada, Yokohama (JP); Takuya Matsuda, Kamakura (JP); Kaori Deura, Yokohama (JP); Masayuki Tanaka, Yokohama (JP); Aya Watase, Tokyo (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 436 days.

(21) Appl. No.: 14/643,165

(22) Filed: Mar. 10, 2015

(65) Prior Publication Data

US 2015/0275369 A1    Oct. 1, 2015

(30) Foreign Application Priority Data

Mar. 31, 2014    (JP) .................................. 2014-073604

(51) Int. Cl.
*C23C 16/455*    (2006.01)
*C23C 16/458*    (2006.01)
(Continued)

(52) U.S. Cl.
CPC .... *C23C 16/45578* (2013.01); *C23C 16/4583* (2013.01); *C30B 25/14* (2013.01);
(Continued)

(58) Field of Classification Search
CPC ........ C23C 16/45512; C23C 16/45563; C23C 16/45565; C23C 16/45568;
(Continued)

(56) References Cited

U.S. PATENT DOCUMENTS 4,108,106 A  *  8/1978  Dozier ................. C23C 16/455
                                                           117/101
4,745,088 A  *  5/1988  Inoue .................. C23C 16/4584
                                                           117/101
(Continued)

FOREIGN PATENT DOCUMENTS

JP         5-332475        12/1993
JP         8-316221 A      11/1996
(Continued)

OTHER PUBLICATIONS

Office Action dated Sep. 29, 2016 in Korean Patent Application No. 10-2015-0029035 (with unedited computer generated English language translation).

(Continued)

*Primary Examiner* — Jeffrie R Lund
*Assistant Examiner* — Stanislav Antolin
(74) *Attorney, Agent, or Firm* — Oblon, McClelland, Maier & Neustadt, L.L.P.

(57) ABSTRACT

According to one embodiment, a gas supply pipe has a first gas pipe configured to blow a gas which has flowed from an inflow opening via first gas blow holes arranged along a longitudinal direction, and a second gas pipe provided in parallel with the first gas pipe. The second gas pipe has second gas blow holes arranged along the longitudinal direction, and allows the gas to flow in a direction opposite to the first gas pipe.

6 Claims, 14 Drawing Sheets

(51) Int. Cl.
*C30B 25/14* (2006.01)
*C30B 31/16* (2006.01)
*H01J 37/32* (2006.01)

(52) U.S. Cl.
CPC .......... *C30B 31/16* (2013.01); *H01J 37/3244* (2013.01); *C23C 16/4584* (2013.01)

(58) Field of Classification Search
CPC .......... C23C 16/4557; C23C 16/45572; C23C 16/45574; C23C 16/45576; C23C 16/45578; C23C 16/4583; C23C 16/4587; C30B 25/14; C30B 31/16; H01J 37/3244
See application file for complete search history.

(56) References Cited

U.S. PATENT DOCUMENTS

| | | | | |
|---|---|---|---|---|
| 4,747,368 A * | 5/1988 | Brien | C23C 16/455 | 118/715 |
| 4,880,163 A * | 11/1989 | Kobayashi | C23C 16/453 | 239/422 |
| 5,012,980 A * | 5/1991 | Viannay | B05B 7/025 | 239/423 |
| 5,029,598 A * | 7/1991 | Stroszynski | C23C 16/455 | 137/1 |
| 5,427,317 A * | 6/1995 | Huttlin | B05B 7/025 | 239/422 |
| 6,089,472 A * | 7/2000 | Carter | C23C 16/455 | 239/422 |
| 6,146,461 A * | 11/2000 | Yang | C23C 16/45578 | 118/715 |
| 6,352,593 B1 * | 3/2002 | Brors | C23C 16/44 | 118/641 |
| 6,416,292 B1 * | 7/2002 | Liehr | B01J 3/006 | 417/48 |
| D771,772 S * | 11/2016 | Morita | | D23/213 |
| D783,351 S * | 4/2017 | Fujino | C23C 16/4584 | 117/101 |
| 2002/0048860 A1 * | 4/2002 | Moriyama | C30B 31/16 | 438/149 |
| 2002/0134507 A1 * | 9/2002 | DeDontney | C23C 16/45576 | 156/345.33 |
| 2003/0207032 A1 * | 11/2003 | Ahn | C23C 16/4412 | 427/255.34 |
| 2004/0025786 A1 * | 2/2004 | Kontani | C23C 16/452 | 118/715 |
| 2004/0083967 A1 * | 5/2004 | Yuda | C23C 16/45519 | 118/715 |
| 2004/0129212 A1 * | 7/2004 | Gadgil | C23C 16/452 | 118/715 |
| 2005/0164518 A1 * | 7/2005 | Hasebe | H01L 21/02238 | 438/766 |
| 2006/0021574 A1 * | 2/2006 | Armour | C23C 16/45565 | 118/715 |
| 2006/0159847 A1 * | 7/2006 | Porter | C23C 16/345 | 427/248.1 |
| 2006/0276051 A1 * | 12/2006 | Hasebe | H01L 21/02238 | 438/766 |
| 2008/0035055 A1 * | 2/2008 | Dip | C23C 16/45578 | 118/715 |
| 2008/0075838 A1 * | 3/2008 | Inoue | C23C 8/10 | 427/58 |
| 2008/0083372 A1 * | 4/2008 | Inoue | C23C 16/45578 | 118/725 |
| 2008/0272700 A1 * | 11/2008 | Lin | H01J 37/3222 | 315/111.21 |
| 2008/0314311 A1 * | 12/2008 | Burrows | C23C 16/4488 | 117/107 |
| 2009/0017638 A1 * | 1/2009 | Yoshino | C23C 16/345 | 438/758 |
| 2009/0098276 A1 * | 4/2009 | Burrows | C23C 16/45565 | 427/8 |
| 2009/0136652 A1 * | 5/2009 | Washington | C23C 16/4488 | 427/8 |
| 2009/0149008 A1 * | 6/2009 | Kryliouk | C23C 16/303 | 438/503 |
| 2009/0203194 A1 * | 8/2009 | Tanaka | C23C 16/407 | 438/478 |
| 2010/0167551 A1 * | 7/2010 | DeDontney | B01J 19/0046 | 438/758 |
| 2011/0186984 A1 * | 8/2011 | Saito | H01L 21/02186 | 257/734 |
| 2011/0212599 A1 * | 9/2011 | Kuribayashi | C23C 16/325 | 438/478 |
| 2011/0308458 A1 | 12/2011 | Sung et al. | | |
| 2012/0076936 A1 * | 3/2012 | Hirano | C23C 16/45563 | 427/248.1 |
| 2012/0100292 A1 * | 4/2012 | Park | C23C 16/45508 | 427/255.28 |
| 2012/0103260 A1 * | 5/2012 | Park | H01L 21/67303 | 118/724 |
| 2012/0156886 A1 * | 6/2012 | Shirako | C23C 16/325 | 438/706 |
| 2012/0167824 A1 * | 7/2012 | Maeng | C23C 16/45572 | 118/724 |
| 2012/0171815 A1 * | 7/2012 | Maeng | C23C 16/303 | 438/107 |
| 2012/0199067 A1 * | 8/2012 | Morozumi | H01L 21/67109 | 118/719 |
| 2013/0084408 A1 * | 4/2013 | Nakao | H01J 37/32229 | 427/569 |
| 2013/0098477 A1 * | 4/2013 | Yudovsky | F17D 3/00 | 137/507 |
| 2013/0299009 A1 * | 11/2013 | Jiang | F16L 53/00 | 137/334 |
| 2014/0076432 A1 * | 3/2014 | Lee | C23C 16/45563 | 137/561 A |
| 2014/0170316 A1 * | 6/2014 | Shibuya | B01J 23/745 | 427/249.1 |
| 2015/0004318 A1 * | 1/2015 | Alasaarela | C23C 16/45544 | 427/255.28 |
| 2015/0322570 A1 * | 11/2015 | Lee | C23C 16/45574 | 137/15.01 |
| 2015/0368798 A1 * | 12/2015 | Kwong | C23C 16/45544 | 118/729 |

FOREIGN PATENT DOCUMENTS

| | | | | |
|---|---|---|---|---|
| JP | 2000-294511 A | 10/2000 | | |
| JP | 2001-102306 A | 4/2001 | | |
| JP | 2001-110730 A | 4/2001 | | |
| JP | 2005-175441 A | 6/2005 | | |
| JP | 2008-78452 A | 4/2008 | | |
| JP | 2012-169307 | 9/2012 | | |
| KR | 2001-0028032 | 4/2001 | | |
| KR | 10-2011-0139079 A | 12/2011 | | |
| WO | WO-2012017717 A1 * | 2/2012 | ........ | H01J 37/32229 |
| WO | WO 2012/120991 A1 | 9/2012 | | |
| WO | WO-2013027797 A1 * | 2/2013 | ........... | B01J 23/745 |
| WO | WO-2013121102 A2 * | 8/2013 | ....... | C23C 16/45544 |
| WO | WO-2014003437 A1 * | 1/2014 | ....... | C23C 16/45574 |
| WO | WO-2014127363 A1 * | 8/2014 | ....... | C23C 16/45544 |

OTHER PUBLICATIONS

Korean Office Action dated Mar. 16, 2016 in Patent Application No. 10-2015-0029035 (with English translation).

* cited by examiner

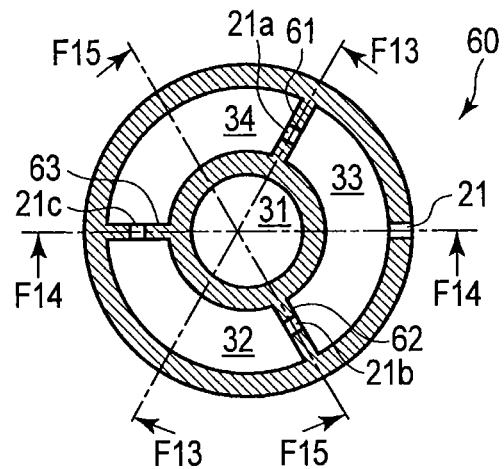
F I G. 12
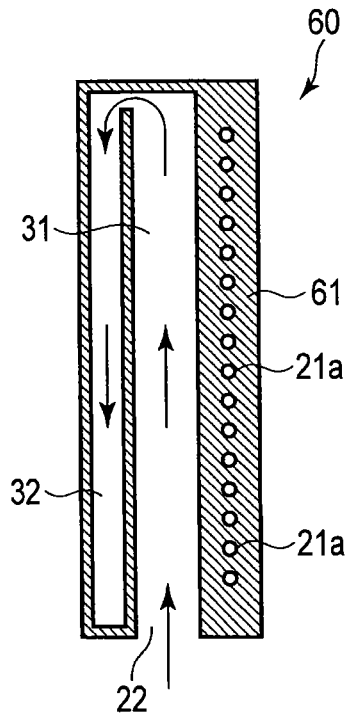
F I G. 13

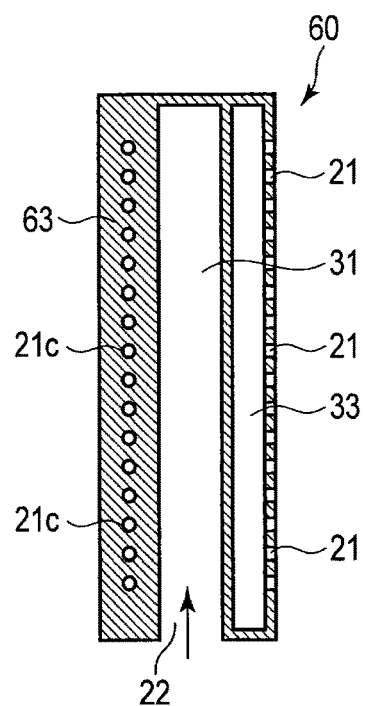
F I G. 14
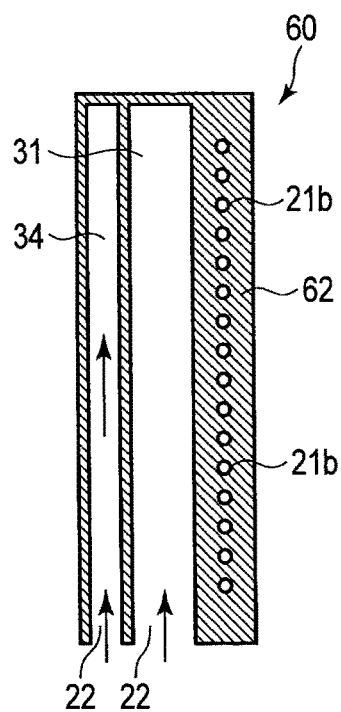
F I G. 15

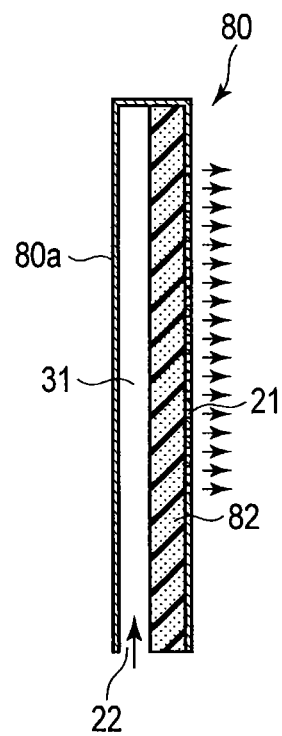
F I G. 17
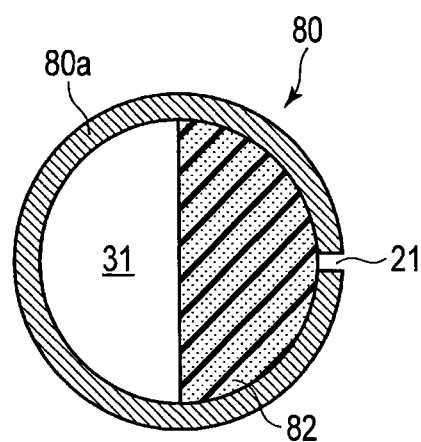
F I G. 18

GAS SUPPLY PIPE, AND GAS TREATMENT EQUIPMENT

CROSS-REFERENCE TO RELATED APPLICATION

This application is based upon and claims the benefit of priority from prior Japanese Patent Application No. 2014-073604, filed Mar. 31, 2014; the entire contents of which are incorporated herein by reference.

FIELD

Embodiments described herein relate generally to a gas supply pipe to supply a source gas to, for example, semiconductor manufacturing equipment, and gas treatment equipment having this gas supply pipe.

BACKGROUND

Semiconductor manufacturing equipment comprises a gas supply pipe extending along a boat in which semiconductor wafers are stacked. The gas supply pipe has gas blow holes arranged along its longitudinal direction, and supplies a source gas to the semiconductor wafers via the gas blow holes.

However, if the gas is supplied from one end of the long gas supply pipe and blows via the gas blow holes, the blow pressure of the gas differs according to the positions of the gas blow holes. One possible way to eliminate this pressure difference is to vary the opening areas of the gas blow holes according to the positions of the holes. However, the configuration of equipment for this purpose becomes complex, and the opening areas need to be adjusted to conditions such as source gas, pressure, and temperature.

Therefore, the development of a gas supply pipe that enables uniform supply of a gas and a gas treatment equipment have been required.

BRIEF DESCRIPTION OF THE DRAWINGS

FIG. 12 is a sectional view of a gas supply pipe according to a sixth embodiment taken along a surface perpendicular to a pipe axis;

FIG. 13 is a sectional view of the gas supply pipe in FIG. 12 taken along the line F13-F13;

FIG. 14 is a sectional view of the gas supply pipe in FIG. 12 taken along the line F14-F14;

FIG. 15 is a sectional view of the gas supply pipe in FIG. 12 taken along the line F15-F15;

FIG. 17 is a longitudinal sectional view of a gas supply pipe according to an eighth embodiment taken along a pipe axis;

FIG. 18 is a cross sectional view of the gas supply pipe in FIG. 17;

DETAILED DESCRIPTION

According to one embodiment, a gas supply pipe has a first gas pipe configured to blow a gas which has flowed from an inflow opening via first gas blow holes arranged along a longitudinal direction, and a second gas pipe provided in parallel with the first gas pipe. The second gas pipe has second gas blow holes arranged along the longitudinal direction, and allows the gas to flow in a direction opposite to the first gas pipe.

Figure 1:
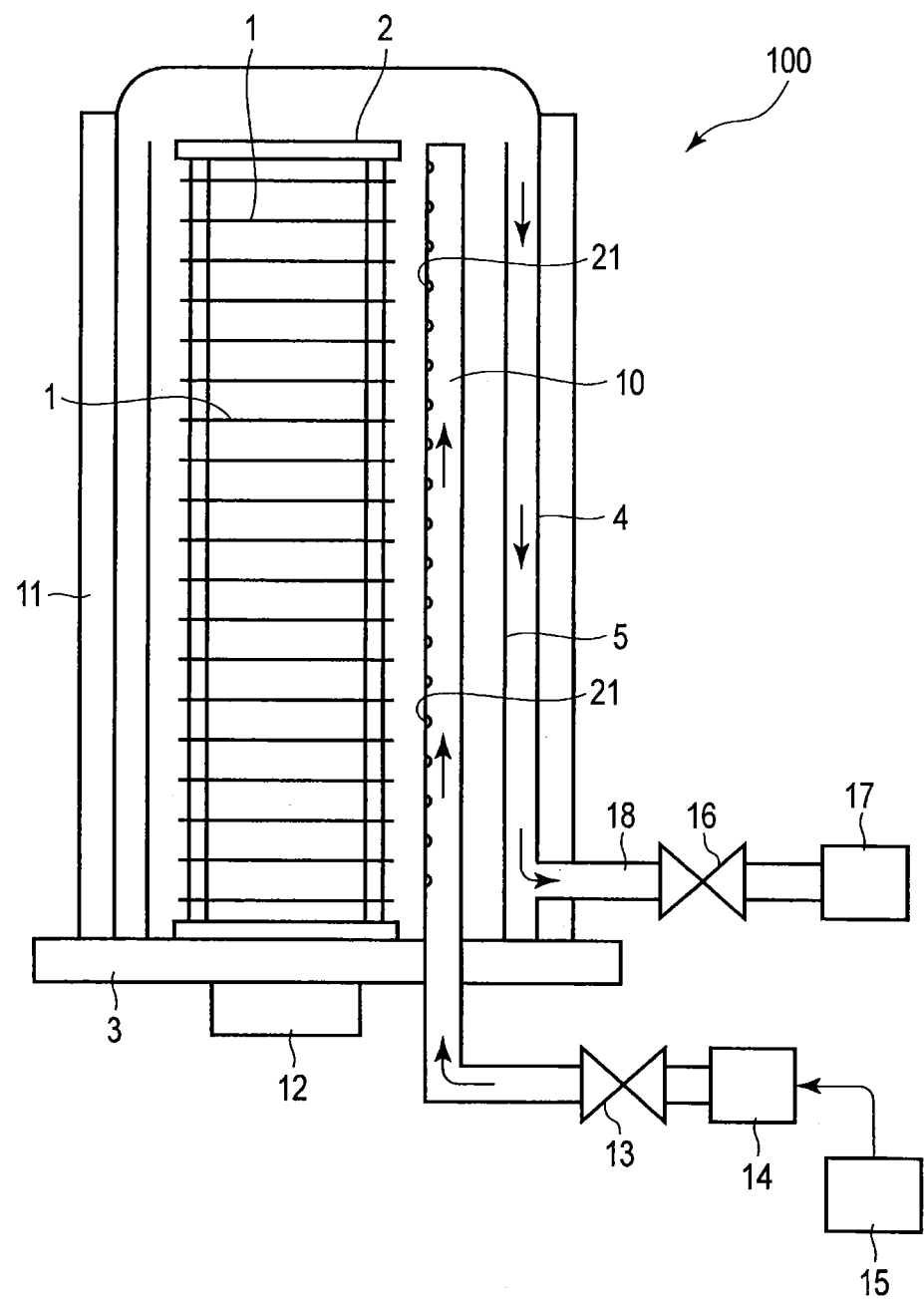
FIG. 1 is a schematic diagram showing semiconductor manufacturing equipment which is a first embodiment of gas treatment equipment.

FIG. 1 is a schematic diagram showing semiconductor manufacturing equipment 100 (hereinafter briefly referred to as manufacturing equipment 100) which is a first embodiment of gas treatment equipment.

The manufacturing equipment 100 has a boat 2 in which semiconductor wafers 1 (treatment targets) are stacked in a gravitational direction, a gas supply pipe 10 extending in the gravitational direction adjacent to the right side of the boat 2 in FIG. 1, a sealing plate 3 which supports the lower end of the boat 2 and through which the gas supply pipe 10 passes, an outer case 4 which surrounds the boat 2 and the gas supply pipe 10 between the sealing plate 3 and the outer case 4, and a cylindrical inner case 5 substantially coaxially disposed inside the outer case 4 outside the boat 2 and the gas supply pipe 10.

A heater 11 is attached to the outside of the outer case 4. A motor 12 to rotate the boat 2 is attached to the lower side of the sealing plate 3 in FIG. 1. An unshown rotation shaft of the motor 12 is connected to the boat 2 through the sealing plate 3. A gas supply source 15 is attached to the proximal end of the gas supply pipe 10 via a supply valve 13 and a flow volume controller 14. Moreover, an exhaust pipe 18 connected to a vacuum pump 17 via an exhaust valve 16 is attached to the vicinity of the lower end of the outer case 4.

The distal end of the gas supply pipe 10 extends to the upper end of the boat 2 and is closed. Gas blow holes 21 are provided in the side surface of the gas supply pipe 10 facing the boat 2. Each of the gas blow holes 21 is positioned between the semiconductor wafers 1 stacked in the boat 2, and the gas blow holes 21 are provided in line in the longitudinal direction of the gas supply pipe 10 at a constant pitch. A detailed structure of the gas supply pipe 10 will be described later in detail.

When the manufacturing equipment 100 is operated, the boat 2 in which the semiconductor wafers 1 are stacked is first disposed in the inner case 5, and the open end (the lower side in FIG. 1) is hermetically closed, with the sealing plate 3. A vacuum is then drawn in the space (treatment chamber) in the outer case 4 by the vacuum pump 17 for decompression. A flow volume of source gas controlled by the flow volume controller 14 is then delivered into the gas supply pipe 10 from the gas supply source 15 via the supply valve 13. As a result, the gas blows toward the semiconductor wafers 1 from the gas blow holes 21.

The pressure (flow volume) of the gas blowing via the gas blow holes 21 needs to be constant so that films of the material will be formed on all the semiconductor wafers 1 with uniform thickness. For example, a possible way is to vary the opening diameters of the gas blow holes 21 to have uniform blow pressure of the gas. However, it is difficult to have uniform blow pressure if there are changes in conditions such as ambient temperature, the kind of source gas, and pressure. Thus, the gas supply pipe 10 according to the present embodiment has the following structure so that the blow pressure of the gas blowing via all the gas blow holes 21 can be uniform in all conditions.

Figure 2:
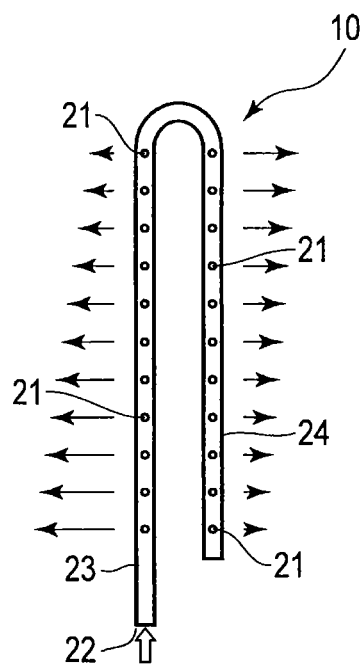
FIG. 2 is a schematic diagram showing a gas supply pipe according to the first embodiment incorporated in manufacturing equipment shown in FIG. 1.

FIG. 2 is a schematic diagram showing the gas supply pipe 10 according to the first embodiment seen from the side of the boat 2. The gas supply pipe 10 is characterized by the structure that is bent into a U-shape. That is, this gas supply pipe 10 has a first gas pipe 23 having an inflow opening 22 into which the source gas delivered from the gas supply source 15 flows, and a second gas pipe 24 provided in parallel along the first gas pipe 23. One end of the second gas pipe 24 is connected to an opposite end of the first gas pipe 23 located apart from the inflow opening. The other end of the second gas pipe 24 is closed. In other words, the gas supply pipe 10 has the structure of one pipe which has one end closed and which is bent partway into a U-shape. The connection part between the first gas pipe 23 and the second gas pipe 24 has a curvature to reduce flow path resistance.

The first gas pipe 23 has the gas blow holes 21 (first gas blow holes) arranged apart from one another along the longitudinal direction at a constant pitch. The second gas pipe 24 also has gas blow holes 21 (second gas blow holes) arranged apart from one another along the longitudinal direction at the same pitch. The gas blow holes 21 of the first gas pipe 23 and the gas blow holes 21 of the second gas pipe 24 are each positioned right between the semiconductor wafers 1 stacked in the boat 2, and each pair of gas blow holes 21, 21 is located at the same height position. In other words, two gas blow holes 21, 21 are allocated to one semiconductor wafer 1. The gas blow holes 21 of the first gas pipe 23 and the gas blow holes 21 of the second gas pipe 24 each blow the gas in a direction toward the rotation center of the boat 2, that is, the center of the semiconductor wafer 1. All the gas blow holes 21 are circular holes having the same opening diameter.

The gas supply pipe 10 is bent into the U-shape so that the direction of the gas flowing through the second gas pipe 24 is opposite to the direction of the gas flowing through the first gas pipe 23. While the pressure intensities of the gas blowing from the gas blow holes 21 are represented by the lengths of arrows in FIG. 2, the arrows are drawn on a plane for clarity of explanation, and are different from actual blow directions (directions toward the front side of the drawing).

The gas blow holes 21 provided apart from one another in the longitudinal direction of the gas supply pipe 10 are located at difference distances from the inflow opening 22. Thus, as indicated by the arrows in FIG. 2, the pressures (flow volumes) of the gas blowing from the gas blow holes 21 vary according to the distance from the inflow opening 22. Specifically, the pressures of the gas blowing from the gas blow holes 21 closer to the inflow opening 22 are relatively high, whereas the pressures of the gas blowing from the gas blow holes 21 farther from the inflow opening 22 are relatively low. In the present embodiment, the gas supply pipe 10 is folded back partway 180° to the opposite side so that the average pressure (total flow volume) of the gas blowing from adjacent two gas blow holes 21 is uniform.

Consequently, the pressure of the gas supplied to each semiconductor wafer 1 can be averaged, and the material formed into a film on each semiconductor wafer 1 can have uniform thickness.

Figure 3:
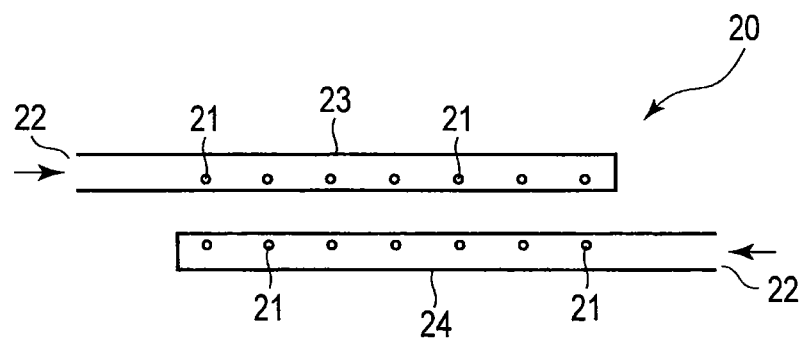
FIG. 3 is a schematic diagram showing a gas supply pipe according to a second embodiment.

FIG. 3 is a schematic diagram of a gas supply pipe 20 according to a second embodiment. In each embodiment described below, components which function in a manner similar to the components in the first embodiment are provided with the same reference signs, and are not described in detail.

The gas supply pipe 20 has a first gas pipe 23 extending in a horizontal direction, and a second gas pipe 24 extending in the horizontal direction alongside of the first gas pipe 23. An inflow opening 22 of a source gas is provided at the left end of the first gas pipe 23 shown in the drawing, and the right end of the first gas pipe 23 shown in the drawing is closed. An inflow opening 22 of the source gas is provided at the right end of the second gas pipe 24 shown in the drawing, and the left end of the second gas pipe 24 shown in the drawing is closed. That is, the first gas pipe 23 and the second gas pipe 24 are independent of each other.

The first gas pipe 23 has gas blow holes 21 (first gas blow holes) arranged apart from one another along the longitudinal direction. The second gas pipe 24 also has gas blow holes 21 (second gas blow holes) arranged apart from one another along the longitudinal direction. The gas blow holes 21 of the gas pipes 23 and 24 may be located to face each other at a constant pitch as shown, or may be arranged at different pitches or staggered in the longitudinal direction.

As in the present embodiment, the gas supply pipe 20 does not always need to be composed of one pipe. If the pressure of the source gas flowing in via the inflow opening 22 of the first gas pipe 23 is the same as the pressure of the source gas flowing in via the inflow opening 22 of the second gas pipe 24, the sum of the volume of gas blowing from the gas blow hole 21 of the first gas pipe 23 and the volume of gas blowing from the gas blow hole 21 of the second gas pipe 24 will be the same in each pair.

In the present embodiment, in particular, the first gas pipe 23 and the second gas pipe 24 are independent of each other. Therefore, the gas reduced in pressure through the first gas pipe 23 is not delivered into the second gas pipe 24, the pressure change of the gas flowing through the first gas pipe 23 can be the same as the pressure change of the gas flowing through the second gas pipe 24, and the pressure of the gas blowing from each pair of gas blow holes 21 can be more uniform.

Figure 4:
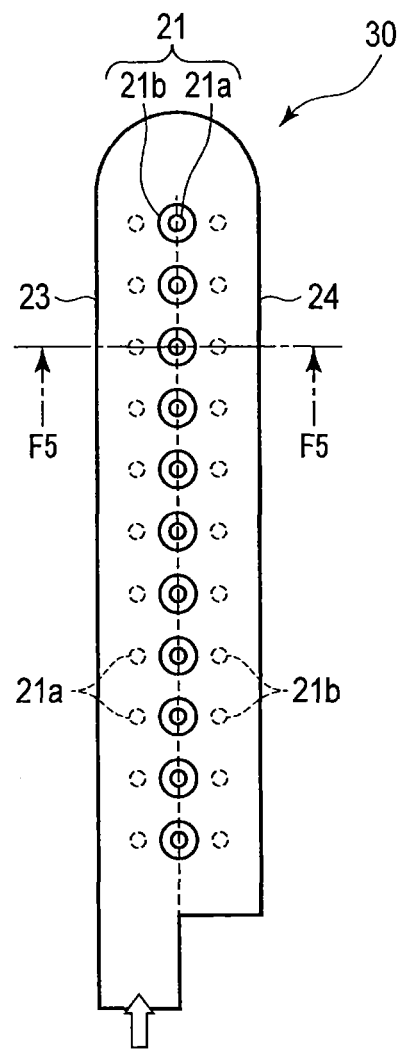
FIG. 4 is a schematic diagram showing a gas supply pipe according to a third embodiment.
Figure 5:
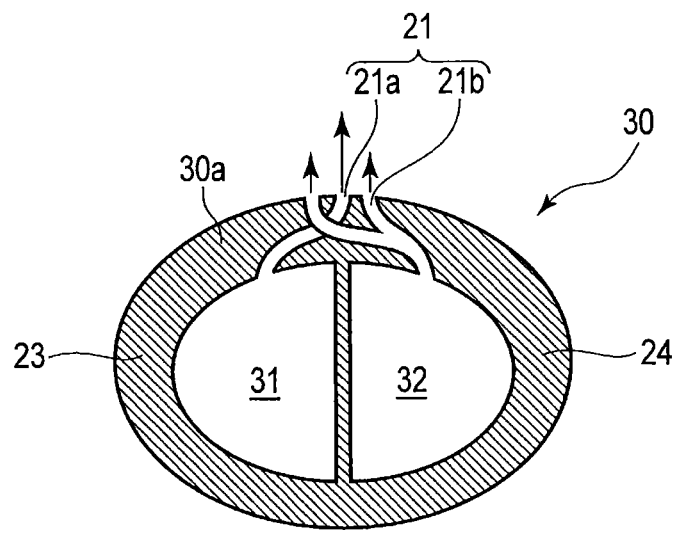
FIG. 5 is a sectional view of the gas supply pipe in FIG. 4 taken along the line F5-F5.
Figure 6:
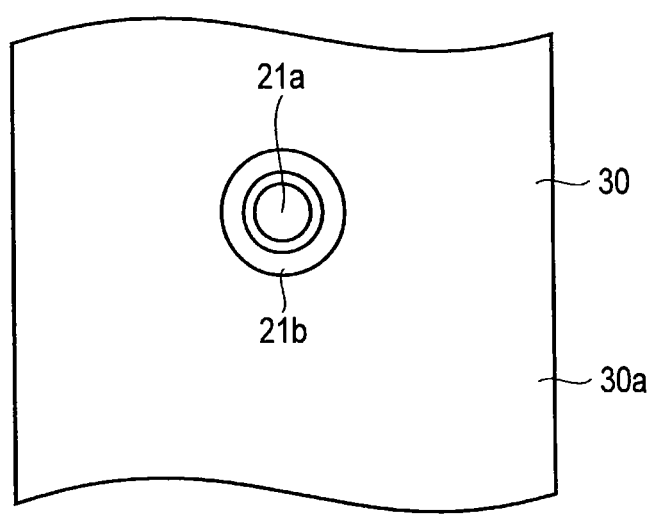
FIG. 6 is a partially enlarged view showing a gas blow hole of the gas supply pipe in FIG. 4.

FIG. 4 is a schematic diagram of a gas supply pipe 30 according to a third embodiment. FIG. 5 is a sectional view of the gas supply pipe 30 taken along the line F5-F5 in FIG. 4. FIG. 6 is a partially enlarged view showing a gas blow hole 21 of the gas supply pipe 30 in enlarged form.

As shown in FIG. 6, the gas supply pipe 30 is characterized by the structure in which a first gas blow hole 21a provided in a first gas pipe 23 is disposed coaxially with a second gas blow hole 21b provided in a second gas pipe 24 to correspond to the first gas blow hole 21a. The structure is similar in other respects to that according to the first embodiment described above.

As shown in FIG. 5, the gas supply pipe 30 has a structure in which the inside of a pipe 30a having a substantially elliptical sectional shape is divided into two flow paths 31 and 32. The sectional shape of the pipe 30a may be a different shape such as a circular shape or an oval shape. For example, the left flow path 31 in FIG. 5 is the flow path for the first gas pipe 23, and the right flow path 32 in FIG. 5 is the flow path for the second gas pipe 24.

The first gas blow hole 21a connects the outer surface of the pipe 30a to the flow path 31 of the first gas pipe 23. As shown in FIG. 6, the opening shape of the first gas blow hole 21a in the outer surface of the pipe 30a is circular. On the other hand, the second gas blow hole 21b connects the outer surface of the pipe 30a to the flow path 32 of the second gas pipe 24, as shown in FIG. 5. As shown in FIG. 6, the opening shape of the second gas blow hole 21b in the outer surface of the pipe 30a is a circular-ring shape that coaxially surrounds the first gas blow hole 21a. The first gas blow hole 21a and the second gas blow hole 21b are laid out without interfering with each other in the thickness of the pipe 30a. For example, three-dimensional forming technology such as three-dimensional printers can be used to obtain such gas blow holes 21a and 21b.

As in the present embodiment, the first gas blow hole 21a and the second gas blow hole 21b are coaxially arranged so that the gas blow direction can be stable when gasses of two systems are mixed. As in the present embodiment, the first gas blow hole 21a which is relatively high in blow pressure may be disposed in the center, and the second gas blow hole 21b which is relatively low in blow pressure may be disposed on the outside. However, the first gas blow hole 21a may be disposed on the outside, and the second gas blow hole 21b may be disposed in the center.

Figure 7:
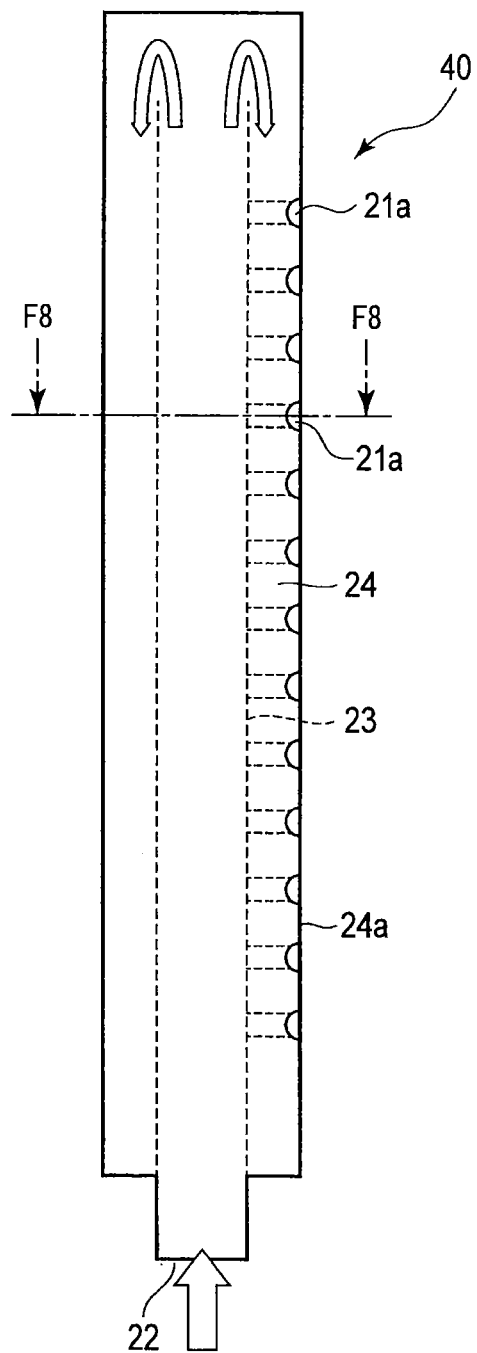
FIG. 7 is a schematic diagram showing a gas supply pipe according to a fourth embodiment.
Figure 8:
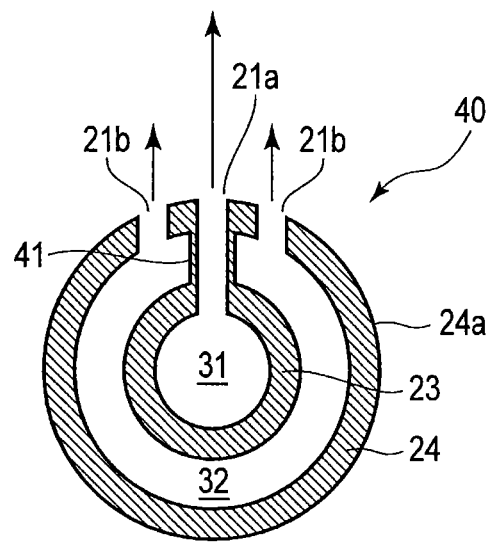
FIG. 8 is a sectional view of the gas supply pipe in FIG. 7 taken along the line F8-F8.
Figure 9:
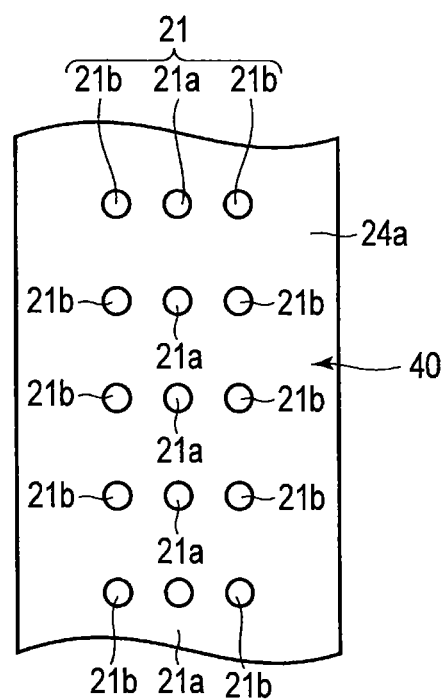
FIG. 9 is a partially enlarged view showing gas blow holes of the gas supply pipe in FIG. 7.

FIG. 7 is a schematic diagram of a gas supply pipe 40 according to a fourth embodiment. FIG. 8 is a sectional view of the gas supply pipe 40 taken along the line F8-F8 in FIG. 7. FIG. 9 is a partially enlarged view showing a gas blow hole 21 of the gas supply pipe 40 in enlarged form.

As shown in FIG. 7 and FIG. 8, the gas supply pipe 40 according to the present embodiment has a double pipe structure in which a second gas pipe 24 is coaxially disposed outside a first gas pipe 23.

Branch pipes 41 which link a flow path 31 of the first gas pipe 23 to an outer surface 24a of the second gas pipe 24 are provided to protrude on the sidewall of the inside first gas pipe 23. The sectional shapes of the branch pipes 41 are circular. Holes through which the branch pipes 41 are open in the outer surface 24a of the second gas pipe 24 are first gas blow holes 21a.

The outside second gas pipe 24 comprises two gas blow holes 21b corresponding to one gas blow hole 21a mentioned above. That is, as shown in FIG. 9, the second gas pipe 24 is provided with the first gas blow holes 21a arranged along the longitudinal direction of the gas supply pipe 40 at a constant pitch, and two rows of the second gas blow holes 21b arranged to circumferentially sandwich the row of the first gas blow holes 21a.

When one set of gas blow holes 21a, 21b, 21b is seen, a relatively high-pressure gas blows from the central first gas blow hole 21a, and a relatively low-pressure gas (the pressures of the gas blowing from the two gas blow holes 21b, 21b are substantially the same) blows from the second gas blow holes 21b, 21b on both sides (indicated by arrows in FIG. 8). Therefore, the blow direction of the gas through the gas blow hole 21 is stabilized regarding the circumferential direction of the gas supply pipe 40.

The same applies to the use of the gas blow hole 21 having the coaxial structure described with reference to FIG. 6. In each case, for example, the three-dimensional forming technology can be used to obtain the structure of the gas blow hole 21 according to the present embodiment, as in the third embodiment.

Figure 10:
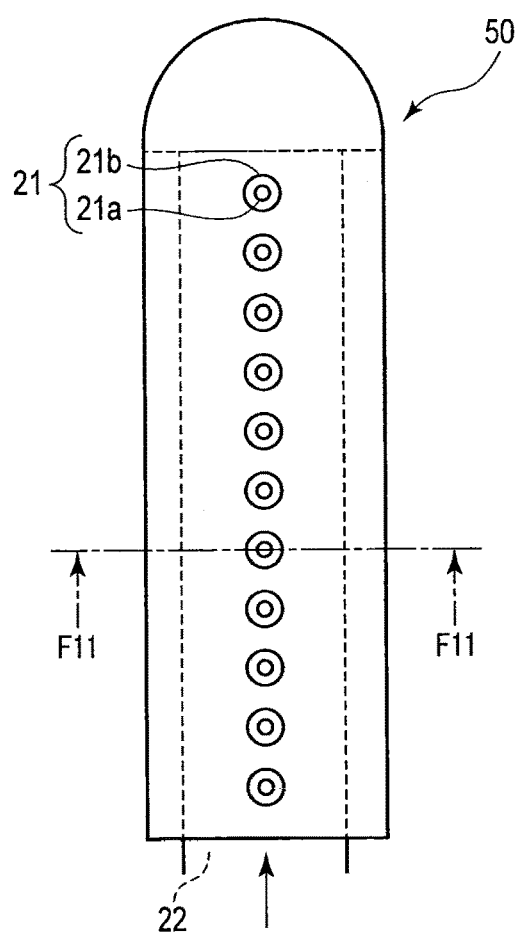
FIG. 10 is a schematic diagram showing a gas supply pipe according to a fifth embodiment.
Figure 11:
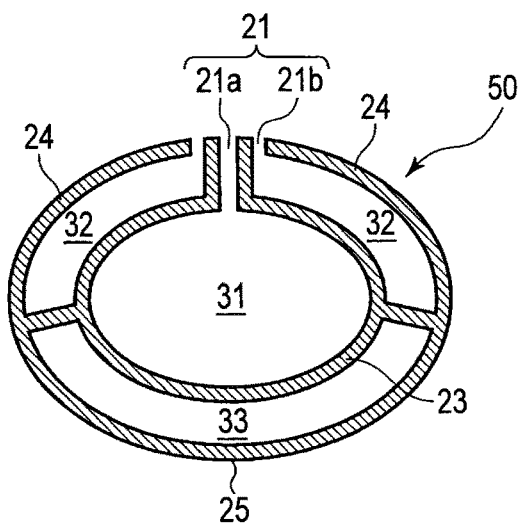
FIG. 11 is a sectional view of the gas supply pipe in FIG. 10 taken along the line F11-F11.

FIG. 10 is a schematic diagram of a gas supply pipe 50 according to a fifth embodiment. FIG. 11 is a sectional view of the gas supply pipe 50 taken along the line F11-F11 in FIG. 10.

This gas supply pipe 50 has a third gas pipe 25 which has another inflow opening 22 adjacent to an inflow opening 22 of the first gas pipe 23 and through which the end opposite to the inflow opening 22 is connected to the inflow side end of a second gas pipe 24. The third gas pipe 25 has no gas blow hole 21. A first gas blow hole 21a provided in the first gas pipe 23 and the second gas blow hole 21b provided in the second gas pipe 24 are coaxially arranged as shown in FIG. 10. The configuration is similar in other respects to that according to the first embodiment described above.

The sectional area of a flow path 31 of the first gas pipe 23, the sectional area of a flow path 32 of the second gas pipe 24, and the sectional area of a flow path 33 of the third gas pipe 25 are designed to be the same. Thus, as in the second embodiment described with reference to FIG. 3, the pressure change of the gas flowing through the first gas pipe 23 can be the same as the pressure change of the gas flowing through the second gas pipe 24 in the opposite direction, and the blow pressure (total flow volume) of the gas blowing via each pair of gas blow holes 21a and 21b can be uniform.

FIG. 12 is a sectional view of a gas supply pipe 60 according to a sixth embodiment taken along a surface perpendicular to a pipe axis. FIG. 13 is a sectional view of the gas supply pipe 60 taken along the line F13-F13 in FIG. 12. FIG. 14 is a sectional view of the gas supply pipe 60 taken along the line F14-F14 in FIG. 12. FIG. 15 is a sectional view of the gas supply pipe 60 taken along the line F15-F15 in FIG. 12.

As shown in FIG. 12, the gas supply pipe 60 comprises three flow paths 32, 33, and 34 outside a central flow path 31 having a substantially circular sectional shape, and has a pipe structure which is substantially circular in section as a whole.

As shown in FIG. 13, an inflow opening 22 for the gas is provided at the lower end of the central flow path 31. The flow path 31 and the flow path 32 are connected at the upper end. The lower end of the flow path 32 is closed. A partition 61 which separates the flow path 33 from the flow path 34 is provided with gas blow holes 21a.

As shown in FIG. 14, the upper end and lower end of the flow path 33 are closed. A partition 63 which separates the flow path 32 from the flow path 34 is provided with gas circulation holes 21c. As shown in FIG. 15, an inflow opening 22 for the gas is provided at the lower end of the flow path 34, and the upper end of the flow path 34 is closed. A partition 62 which separates the flow path 32 from the flow path 33 is provided with gas blow holes 21b.

The gas which has flowed in from the inflow opening 22 at the lower end of the central flow path 31 flows from the upper end of the flow path 31 to the upper end of the flow path 32, and blows into the flow path 33 via the gas blow holes 21b. On the other hand, the gas which has flowed in from the inflow opening 22 at the lower end of the flow path 34 blows into the flow path 33 via the gas blow holes 21a. That is, in the flow path 33, the gasses blowing from the gas blow holes 21a and 21b provided in the partitions 61 and 62 on both sides are mixed.

The gas blowing from the gas blow holes 21a on the side of the flow path 34 gradually decreases in blow pressure from the lower end of the flow path 34 toward the upper end, and the gas blowing from the gas blow holes 21b on the side of the flow path 32 gradually decreases in blow pressure from the upper end of the flow path 32 toward the lower end. That is, in the present embodiment as well as in the previously described embodiments, the pressures of the gasses which join in the flow path 33 become uniform along the longitudinal direction. Thus, the blow pressure of the gas blowing from the flow path 33 to the outside via the gas blow holes 21 can also be uniform along the longitudinal direction.

Although the partition 63 which separates the flow path 32 from the flow path 34 is also provided with the gas circulation holes 21c in the present embodiment, the flow path 32 can be connected to the flow path 34 via the gas circulation holes 21c to lessen the pressure difference of the two flow paths along the longitudinal direction. That is, the gas circulation holes 21c are not components indispensable to the invention but are components advantageous to more uniform blow pressure of the gas which finally blows to the outside via the gas blow hole 21 of the flow path 33.

FIG. 16(a) is a cross sectional view showing a gas supply pipe 70 according to a seventh embodiment taken along a surface perpendicular to a pipe axis, and FIG. 16(b) is a longitudinal sectional view taken along the pipe axis. This gas supply pipe 70 has a structure in which the inside of a pipe having a substantially circular sectional shape is longitudinally divided into two parts, as in the gas supply pipe 30 according to the third embodiment described with reference to FIG. 5.

Figure 16:
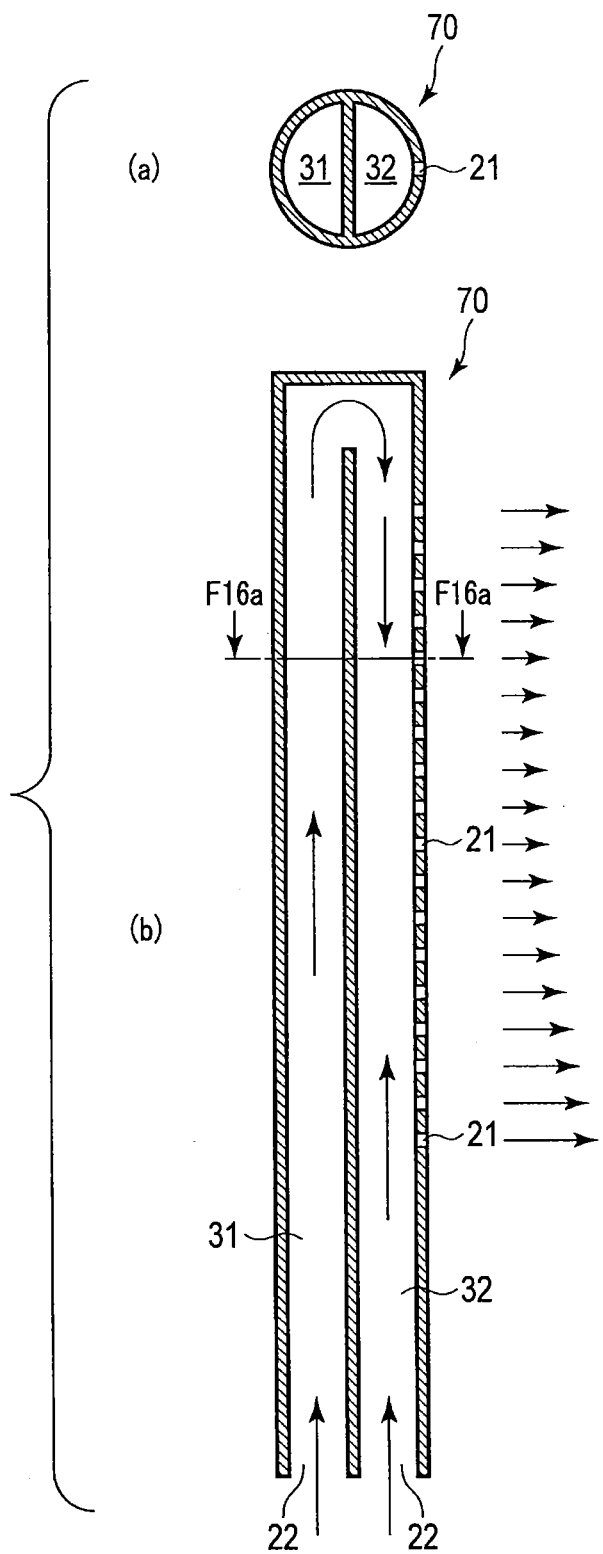
FIG. 16(a) is a cross sectional view showing a gas supply pipe according to a seventh embodiment.
FIG. 16(b) is a longitudinal sectional view.

An inflow opening 22 of the gas is provided at the lower end of one left flow path 31 in FIG. 16, and the upper end of the flow path 31 is connected to the upper end of the adjacent other flow path 32. Another inflow opening 22 is provided at the lower end of the other flow path 32. Gas blow holes 21 located apart from one another along the longitudinal direction are provided in the outer circumferential wall of a pipe on the side of the flow path 32.

The gas which has flowed into the left flow path 31 in the drawing flows into the other flow path 32 via the upper end of the flow path 31. At the same time, this gas collides along the flow path 32 with the gas which has flowed in via the right flow path 32 in the drawing. As a result, the blow pressure of the gas blowing via the gas blow holes 21 provided on the side of the flow path 32 can be uniform in each of the gas blow holes 21 as indicated by arrows.

If the two flow paths 31 and 32 have the same sectional area so that the gas flows in via two inflow openings 22, 22 with the same pressure, the gas pressure is lower in the flow path 32 having the gas blow holes 21. Therefore, under this condition, the gas flowing through the flow path 31 having no gas blow holes 21 flows into the other flow path 32.

FIG. 17 is a longitudinal sectional view of a gas supply pipe 80 according to an eighth embodiment. FIG. 18 is a cross sectional view of the gas supply pipe 80.

This gas supply pipe 80 has one pipe 80a having a substantially circular sectional shape, and comprises gas blow holes 21 along the circumferential wall of the pipe 80a. In this pipe 80a, a lattice 82 which accounts for substantially half of the space in the pipe is provided. Specifically, the lattice 82 is disposed at the position to close the insides of the gas blow holes 21. The lattice 82 is a porous material having pores, and is a structure which permits gas circulation.

Thus, the lattice 82 is disposed in the pipe 80a having the gas blow holes 21, so that pressure loss is increased when the gas flowing through a flow path 31 having no lattice 82 disposed therein flows toward the gas blow holes 21, and the blow pressure of the gas can be thus averaged.

Figure 19:
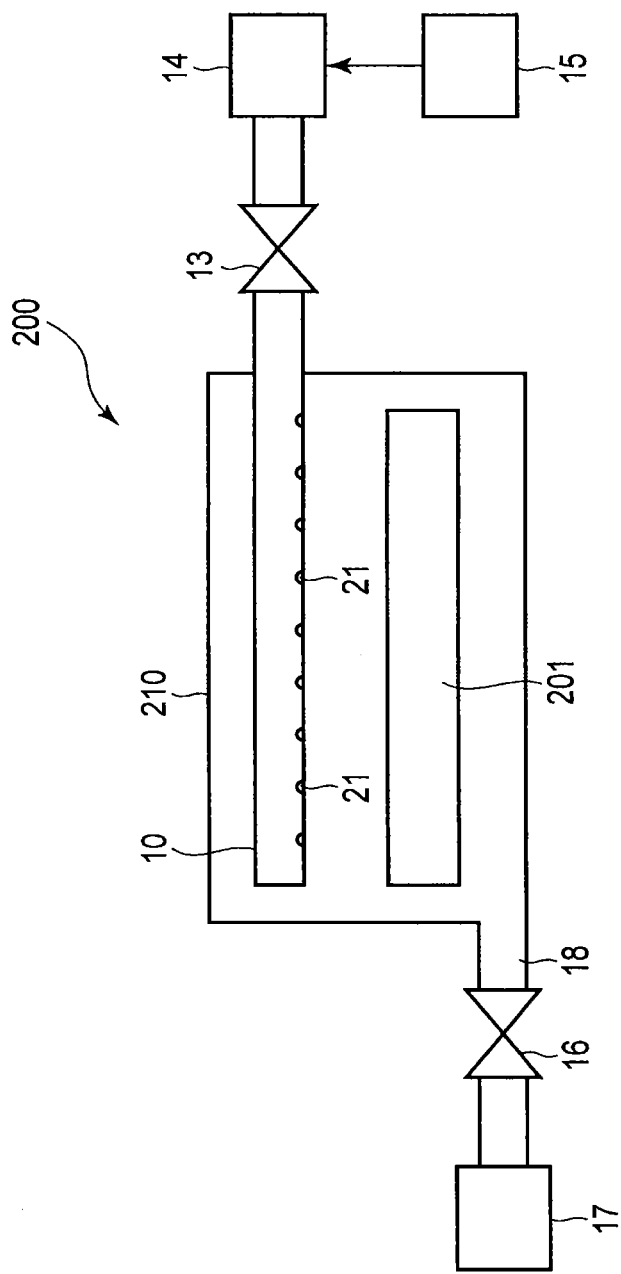
FIG. 19 is a schematic diagram showing gas treatment equipment according to the second embodiment.

FIG. 19 is a schematic diagram showing gas treatment equipment 200 according to the second embodiment.

This gas treatment equipment 200 has a gas supply pipe 10 along a treatment target 201 set in a treatment chamber 210. The gas supply pipes 20, 30, 40, 50, 60, 70, and 80 according to the previously described second to eighth embodiments may be used instead of the gas supply pipe 10.

A gas supply source 15 is connected to the proximal end of the gas supply pipe 10 via a supply valve 13 and a flow volume controller 14. A vacuum pump 17 is connected to an exhaust pipe 18 of the treatment chamber 210 via an exhaust valve 16. This gas treatment equipment 200 operates in a manner similar to the manufacturing equipment 100 according to the first embodiment described above.

The gas treatment equipment 200 according to the present embodiment can supply a uniform volume of gas to the treatment target 201 along the longitudinal direction of the gas supply pipe 10.

In this case, as in the embodiments described above, each of gas blow holes 21a of a first gas pipe 23 and each of gas blow holes 21b of a second gas pipe 24 may be located at the same position, or the gas blow holes 21a and the gas blow holes 21b may be out of phase.

Figure 20:
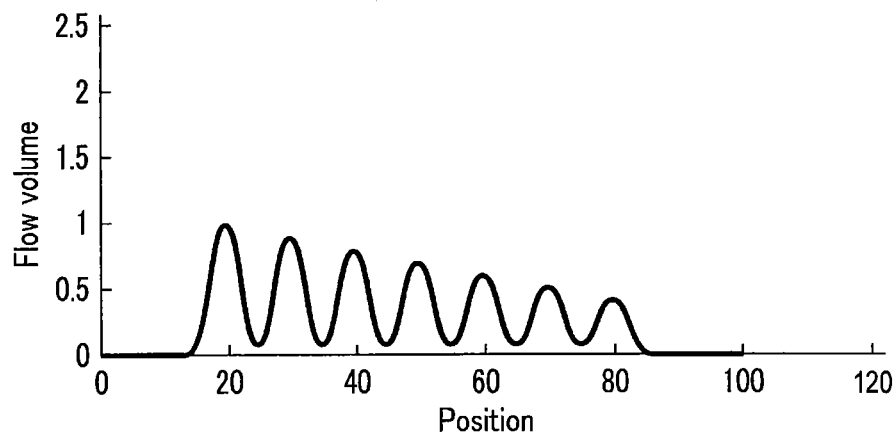
FIG. 20 is a graph showing a gas flow volume distribution along the gas supply pipe when the gas blows via the gas blow holes of a first gas pipe of the gas supply pipe in FIG. 2.
Figure 21:
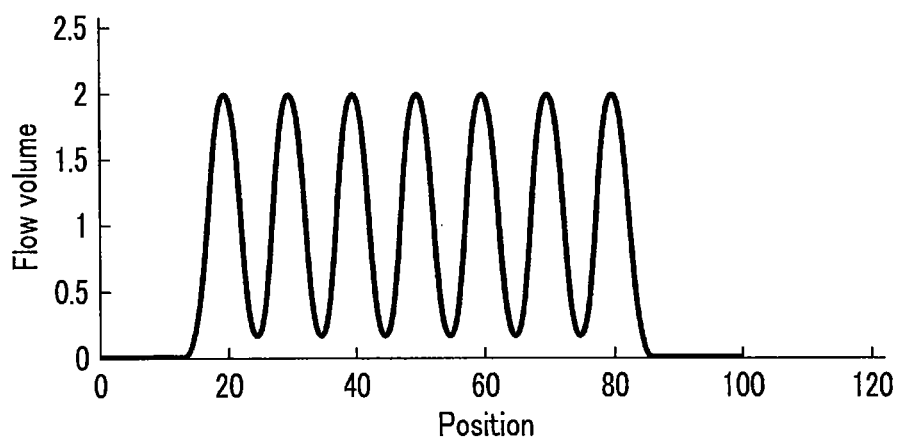
FIG. 21 is a graph showing a gas flow volume distribution along the gas supply pipe when the gas blows via the gas blow holes of the first gas pipe of the gas supply pipe in FIG. 2 and the gas blows via gas blow holes of a second gas pipe arranged in phase.

FIG. 20 is a graph showing a gas flow volume distribution along the longitudinal direction of the first gas pipe 23, for example, when the gas blows via the gas blow holes 21a of the first gas pipe 23. FIG. 21 is a graph showing a gas flow volume distribution along the longitudinal direction of the gas supply pipe 10 when the gas blows via the first gas blow holes 21a of the first gas pipe 23 and the gas blows via the second gas blow holes 21b of the second gas pipe 24.

As obvious from the above, when the first gas blow holes 21a and the second gas blow holes 21b face each other (arranged in phase) as in the embodiments described above, the flow volume of the gas blow is uniform at the position of each pair of the gas blow holes 21, but the gas flow volume is lower at the position between the adjacent gas blow holes 21. That is, in this case, the difference between the peak (maximum) of the gas flow volume and the position (minimum) of the smallest flow volume is greater.

Figure 22:
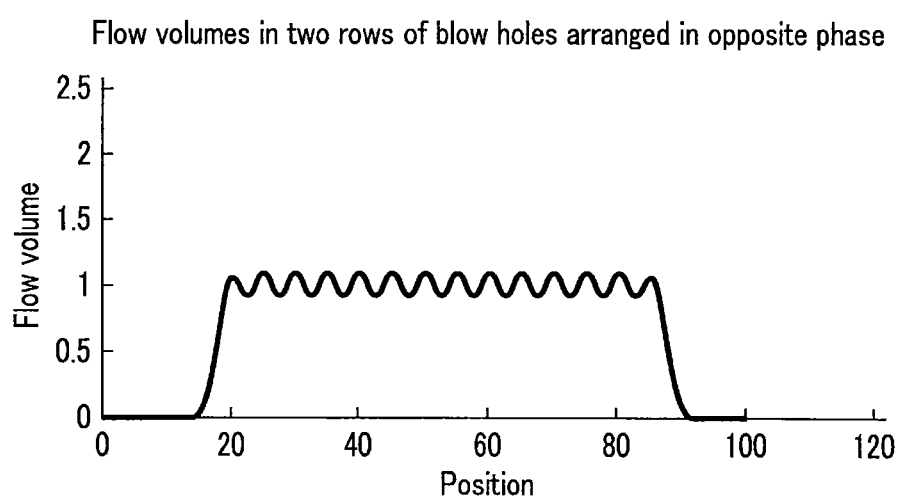
FIG. 22 is a graph showing a gas flow volume distribution along the gas supply pipe when the gas blows via the gas blow holes of the first gas pipe of the gas supply pipe in FIG. 2 and the gas blows via the gas blow holes of the second gas pipe arranged in opposite phase.

In contrast, when the first gas blow holes 21a of the first gas pipe 23 and the second gas blow holes 21b of the second gas pipe 24 are alternately arranged (arranged in opposite phase) to be half pitch staggered along the longitudinal direction of the gas supply pipe 10, the peak of the gas flow volume is uniform along the longitudinal direction of the gas supply pipe 10, and there is almost no difference of flow volume as shown in FIG. 22.

For example, the layout in which two rows of the gas blow holes 21a and 21b are arranged in phase is advantageous in the case of an operation wherein the gas supply volume is constant for each of the semiconductor wafers 1 stacked in the boat 2, as in the manufacturing equipment 100 according to the first embodiment described above. On the other hand, the layout in which two rows of the gas blow holes 21a and 21b are arranged in opposite phase is advantageous in the case of an operation wherein the gas is uniformly supplied to the entire treatment target 201, as in the second embodiment. That is, any layout of the gas blow holes 21 can be set in accordance with the operation of the equipment.

According to the gas supply pipe or the gas treatment equipment in at least one embodiment described above, the first gas pipe comprising the gas blow holes and the second gas pipe comprising the gas blow holes are provided in parallel so that the gas flows in opposite directions. Consequently, the gas can be uniformly supplied along the longitudinal direction of the gas supply pipe.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A gas supply pipe comprising:
a first gas pipe having an inflow opening into which a gas flows and having first gas blow holes arranged apart from one another along a longitudinal direction; and
a second gas pipe provided coaxially with the first gas pipe, the second gas pipe having second gas blow holes arranged apart from one another along the longitudinal direction, and allowing the gas to flow in a direction opposite to the first gas pipe, wherein
each of the first gas blow holes corresponds to two or more of the second gas blow holes, forming a set of blow holes;
in each set of blow holes, the first gas blow hole is sandwiched by the two or more second gas blow holes;
two or more sets of blow holes are arranged apart from one another in the first gas pipe and the second gas pipe; and
the first gas blow holes and the second gas blow holes allow the gas to blow therefrom toward a center of a treatment target.

2. The gas supply pipe of claim 1, wherein an end of the first gas pipe opposite to the inflow opening is connected to an inflow side end of the second gas pipe.

3. The gas supply pipe of claim 1, wherein the pitch of the first gas blow holes is the same as the pitch of the second gas blow holes.

4. Gas treatment equipment comprising:
a treatment chamber containing a treatment target;
a gas supply pipe configured to supply a gas into the treatment chamber; and
a gas supply source connected to an inflow opening of the gas supply pipe, the gas supply pipe comprising
a first gas pipe having the inflow opening into which the gas flows and having first gas blow holes arranged apart from one another along a longitudinal direction, and
a second gas pipe provided coaxially with the first gas pipe, the second gas pipe having second gas blow holes arranged apart from one another along the longitudinal direction, and allowing the gas to flow in a direction opposite to the first gas pipe, wherein
each of the first gas blow holes corresponds to two or more of the second gas blow holes, forming a set of blow holes;
in each set of blow holes, the first gas blow hole is sandwiched by the two or more second gas blow holes;
two or more sets of blow holes are arranged apart from one another in the first gas pipe and the second gas pipe; and
the first gas blow holes and the second gas blow holes allow the gas to blow therefrom toward a center of the treatment target.

5. The gas treatment equipment of claim 4, wherein an end of the first gas pipe opposite to the inflow opening is connected to an inflow side end of the second gas pipe.

6. The gas treatment equipment of claim 4, wherein the pitch of the first gas blow holes is the same as the pitch of the second gas blow holes.

* * * * *